US008859879B2

(12) United States Patent
Doraiswami et al.

(10) Patent No.: US 8,859,879 B2
(45) Date of Patent: Oct. 14, 2014

(54) ENERGY HARVESTING USING RF MEMS

(75) Inventors: Ravi Doraiswami, Suwanee, GA (US); Michael G. Pecht, College Park, MD (US); Arvind Sai Sarathi Vasan, College Park, MD (US); Yunhan Huang, College Park, MD (US); Andrew Michael Kluger, San Rafael, CA (US)

(73) Assignee: Oxfordian, L.L.C., Dallas, TX (US)

( * ) Notice: Subject to any disclaimer, the term of this patent is extended or adjusted under 35 U.S.C. 154(b) by 30 days.

(21) Appl. No.: 13/136,087

(22) Filed: Jul. 21, 2011

(65) Prior Publication Data

US 2012/0017978 A1 Jan. 26, 2012

Related U.S. Application Data

(60) Provisional application No. 61/400,120, filed on Jul. 22, 2010.

(51) Int. Cl.
*H01L 31/0216* (2014.01)
*H01L 31/02* (2006.01)
*B81B 3/00* (2006.01)
*H01G 9/20* (2006.01)

(52) U.S. Cl.
CPC ............ *B81B 3/0029* (2013.01); *H01G 9/2059* (2013.01)
USPC ....................................... 136/243

(58) Field of Classification Search
CPC .............................. B81B 3/0029; H01G 9/2059
See application file for complete search history.

(56) References Cited

U.S. PATENT DOCUMENTS

| 5,482,571 | A  | * | 1/1996 | Yamada et al. | 136/251 |
| 2005/0087223 | A1 | * | 4/2005 | Yuasa | 136/251 |
| 2005/0211292 | A1 | * | 9/2005 | Chittibabu et al. | 136/263 |
| 2007/0051403 | A1 | * | 3/2007 | Itami | 136/263 |
| 2007/0089781 | A1 | * | 4/2007 | Kida et al. | 136/261 |
| 2008/0115824 | A1 | * | 5/2008 | Kang et al. | 136/247 |
| 2009/0159123 | A1 | * | 6/2009 | Kothari et al. | 136/256 |

OTHER PUBLICATIONS

Grätzel; Dye-sensitized solar cells; 2003; Elsevier B.V.; Journal of Photochemistry and Photobiology; 4; pp. 145-153.*
Patrocinio, A.O.T. et al.; Efficient and low cost devices for solar energy conversion: Efficiency and stability of some natural-dye-sensitized solar cells; 2009; Elsevier B.V.; Synthetic materials; 159; pp. 2342-2344.*
Lee, Jeong B. et al.; A Miniaturized High-Voltage Solar Cell Array as an Electrostatic MEMS Power Supply; Journal of Microelectromechanical systesm; vol. 4; Sep. 1995; pp. 102-108.*
Goldsmith, Charles L. et al.; Performance of Low-Loss RF MEMS Capacitive Switches; IEEE Microwave and Guided Wave Letters; vol. 8; Aug. 1998; pp. 269-271.*

(Continued)

*Primary Examiner* — Jeffrey T Barton
*Assistant Examiner* — Edward Schmiedel
(74) *Attorney, Agent, or Firm* — Lawrence Edelman; The Law Office of Lawrence Edelman

(57) ABSTRACT

Described herein is an energy harvesting device and a method for its fabrication for the harvesting of solar energy. Solar energy is absorbed using a photosensitive material which is coated upon a flexible membrane, which is suspended over a metal signal line of an RF MEMS structure. By controlling the discharge sequence the stored electrical charge can be transferred as high voltage pulses to an external load or rechargeable batteries. The output voltage can be adjusted by controlling the on/off frequency of operation of the switch.

12 Claims, 4 Drawing Sheets

(56) References Cited

OTHER PUBLICATIONS

Hwang, James C. M.; Reliability of Electrostatically Actuated RF MEMS Switches; IEEE International Workshop on Radio-Frequency Integration Technology; Dec. 2007; pp. 168-171.*

Rijks, Th.G.S.M. et al.; RF MEMS Tunable Capacitors with Large Tuning Ratio; 17th IEEE International Conference on Micro Electro Mechanical Systems; 2004; pp. 777-780.*

Yang-Sian Chen, et al., Manufacture of Dye-Sensized Nano Solar Cells and their I-V Curve Measurements, Proceedings of ICAM 2007, Nov. 26-28, 2007, Taiwan.

Sancun Hao, et al., Natural Dyes as Photosensitizers for Dye-sensitized Solar Cell, Solar Energy 80 (2006) 209-214.

Yunhan Huang, et al., Energy Harvesting using RF MEMS, Electronic Components and Technology Conference, Jun. 2010, pp. 1353-1358.

* cited by examiner

*Switch Up*

*Switch Down*

ENERGY HARVESTING USING RF MEMS

CROSS REFERENCE TO RELATED APPLICATIONS

This application claims priority to U.S. Provisional Application Ser. No. 61/400,120 filed Jul. 22, 2010, entitled Energy Harvesting Using RF MEMS, the contents of which application is incorporated herein by reference as if fully set forth in its entirety.

FIELD OF THE INVENTION

The present invention is in the technical field of energy harvesting. More particularly, the present invention is in the technical field of solar energy harvesting which provides a promising solution for designing self-powered microsystems.

BACKGROUND OF THE INVENTION

Over the past few decades, there has developed a growing gap between the surging power consumption of consumer electronic devices and the power which can be supplied by on-board batteries. Additionally, frequent battery replacement is not an option for some situations, such as wireless sensor networks with thousands of physically embedded nodes. Micro-Electro Mechanical Systems (MEMS) energy harvesting is an emerging alternative for scavenging energy from natural sources, which is essentially inexhaustible, such as mechanical vibration, solar energy, thermal energy, etc. This essentially free energy source is available maintenance-free throughout the lifetime of the application. Many systems, such as wireless sensor networks, portable electronics and cell phones, could use this technology as a power source through some types of MEMS devices, such as electro-magnetic MEMS, electrostatic MEMS, and piezoelectric MEMS.

The currently available MEMS energy harvesting techniques in the market like photovoltaic cells and wind power harvesting have several technical barriers that need to be resolved, including low efficiency, scaling issues, limitations in the fundamentals of physics, and high cost. In solar cells, energy losses come from optical loss due to the shadow of the aluminum electrode grid and reflection from the solar cell surface, quantum efficiency, and internal resistance due to the resistivity of electrode. All prevent solar cell's efficiency from reaching greater than 20%.

SUMMARY OF THE INVENTION

The present invention relates generally to a novel energy harvesting technique for powering wireless sensors, self-powered portable electronics, and computer hierarchy that can overcome the technical barriers of their conventional counterparts in the market, such as solar cells, and wind power harvesters. This energy harvesting technique has advantages over conventional counterparts including scalability, controllable output voltage, and high efficiency, which may push the limitation of current technologies forward substantially.

Herein, according to the invention is described RF MEMS devices, each of which consists of a thin film aluminum membrane connected with an electrical ground suspended over a bottom metal wave guide coated with dielectric (e.g. $SiO_2$) isolation. When a bias voltage is induced between the two metal layers, charge distributes in such a way that an electrostatic force occurs between them, pulling the membrane downward to the bottom metal layer. In this closed position, the two metal layers form a metal-oxide-metal capacitor. To harvest energy, such as solar energy, we replace the electric charge induced by an externally applied bias voltage with a charge generated by a coating of photosensitizing dye that converts sunlight into electricity.

Our MEMS energy harvesting device has the advantage of greater scalability, and higher efficiency than conventional technologies. It can be fabricated on a single chip using microfabrication techniques which enables smaller size and higher integration. Its operation, using discontinuous electrostatic charge transfer, allows charge to diffuse and redistribute more evenly and to scale to different sizes of MEMS.

BRIEF DESCRIPTION OF THE DRAWINGS

So that the above-recited features of the present invention can be understood in detail, a more particular description of the invention, briefly summarized above, may be had by reference to various embodiments, some of which are illustrated in the appended drawings. It is to be noted, however, that the appended drawings are not to scale, and illustrate only typical embodiments of this invention and are therefore not to be considered limiting of its scope, for the invention may admit to other equally effective embodiments.

DETAILED DESCRIPTION OF THE INVENTION

The RF MEMS devices of this invention are designed to have high operating frequency, small size, and controllable capacitor characterization. This novel device combines traditional energy harvesting with RF MEMS in order to provide adjustable output power and achieve scalability. Taken into account are the RF MEMS design parameters, including spring constant, quality factor, switching and releasing speed, response to applied pulses, up-state capacitance, series resistance, return loss, current distribution, and power handling. Arrays of RF MEMS structures with different dimensions and different pull-down voltages and resonance frequencies will determine the highest voltage and the maximum power to be generated.

Figure 1:
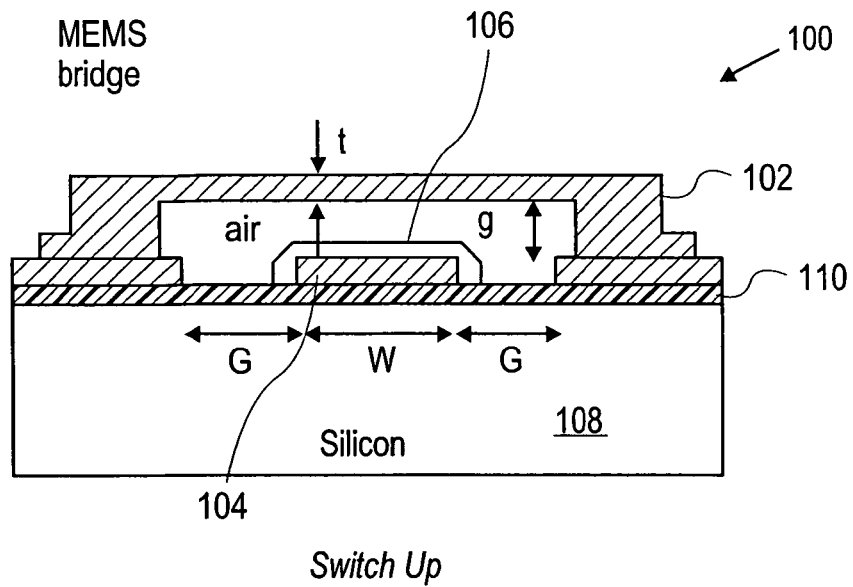
FIG. 1 is a cross-sectional view of an un-actuated RF MEMS switch according to one aspect of this invention.
Figure 2:
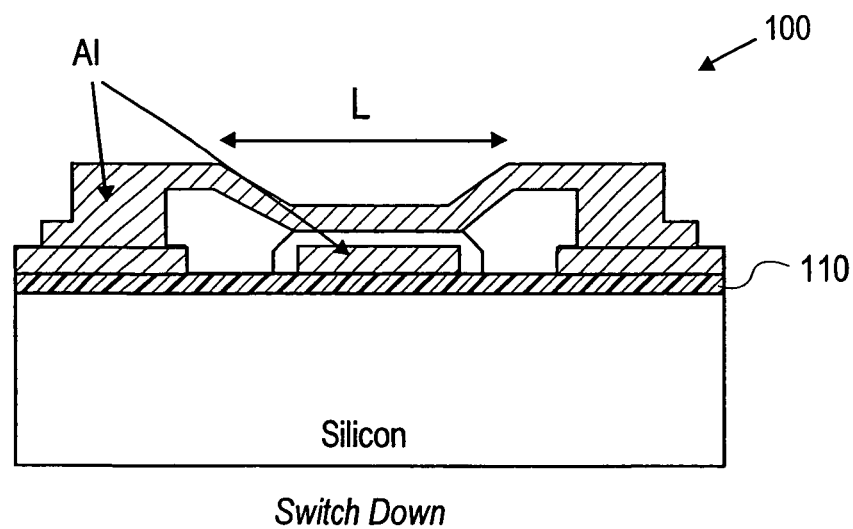
FIG. 2 is a cross-sectional view of the actuated RF MEMS switch of FIG. 1 according to an aspect of this invention.

The basic structure of the capacitive RF MEMS switch is a co-planar waveguide (CPW) shunt switch as illustrated in FIGS. 1 and 2. The RF MEMS switch operates as a digitally tunable capacitor with two states. When the membrane is in the switch up (i.e. off) position, the signal line sees a small value of parasitic capacitance, while when the membrane is switch down (i.e. on) position, the signal lines sees a high value capacitor shunted to ground. In this position the stored charge is transferred from the membrane to the signal line.

Switch 100 consists of a flexible metal membrane 102, in one embodiment made of aluminum, connected with an electrical ground suspended over a current collector, i.e. bottom metal signal line 104, which line is coated with a dielectric isolation layer 106. This layer 106 can be formed of such dielectric materials as silicon dioxide, silicon nitride, silicon carbide, etc. The two metal layers with an air gap and dielectric layer in between them forms a capacitor, which can store electric charge. The structure itself is formed over a rigid and suitably mechanically stable substrate support 108, which comprises a material capable of withstanding the processing temperatures of the fabrication process. Typical of such a substrate support material is a silicon wafer, which in some embodiments, can be coated with a thin insulating layer 110 to electrically isolate the signal line 104 from underlying substrate 108.

Figure 3:
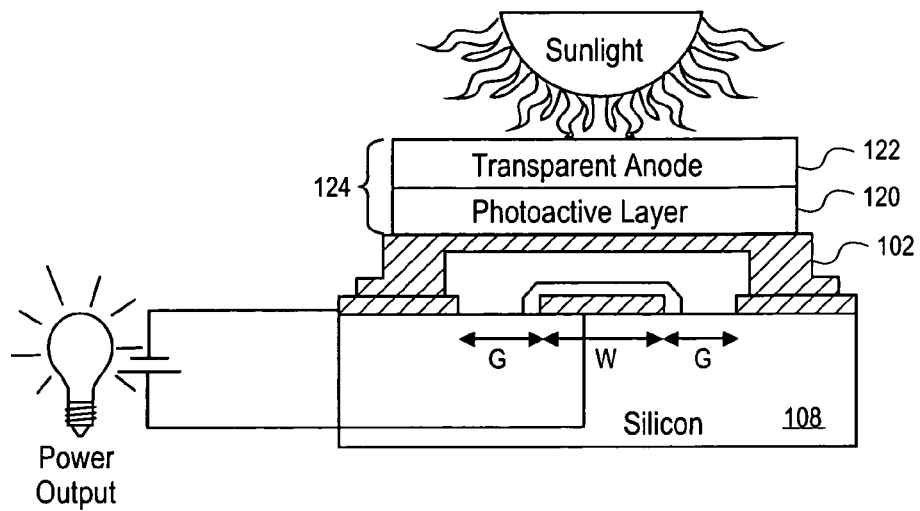
FIG. 3 is a schematic diagram of the structure of the novel energy harvester according to an aspect of this invention, employing the RF MEMS of FIG. 1 wherein a photoactive layer has been deposited over the flexible membrane, with a transparent anode layer deposited over the photoactive layer.

To harvest solar energy, the RF MEMS membrane is coated with a photosensitive material, such as shown in FIG. 3, which converts sunlight (photons) into an electric charge. The generated charge is then stored between the gaps of the suspended membrane and bottom signal line RF MEMS structure. By controlling the charging sequence, the electric charge can be discharged as pulsed energy to an external load or a rechargeable battery. Thus the energy loss in the transferring process can be reduced and the output voltage can be adjusted by controlling the on/off frequency of operation of the switch. By connecting a controllable or programmable switch with the circuit, e.g. relay, semiconductor switch, MEMS ohmic contact switch (not shown), the output charge can be at a different voltage level.

In an embodiment, the photoactive layer 120 can be any photosensitive material that converts photons to electrons. In another embodiment it comprises a photosensitive dye which can be deposited on the flexible membrane in the form of a liquid paste, which is then dried and baked. The charge generated upon exposure of the material to solar radiation accumulates on the surface of the membrane. This charge is stored in the RF MEMS structure because it serves as a capacitor. By controlling the discharge of the RF MEMS, the energy stored can be transferred with high voltage pulses, which help distribute charge in the membrane in such a way that an electrostatic force occurs, and thus higher efficiency can be achieved.

The photosensitive dyes in one embodiment are extracted from plants, these dyes providing a flexible film which can be printed onto the membrane. In one embodiment, photoactive layer 120 is formed using extract from such plants as blue berries, onion, radish, aubergine, purple cabbage, and the like. In one approach, the dye is mixed with a nano powder of $TiO_2$ to form a porous, transparent paste, the paste used to form layer 120, the layer topped by a transparent electrically conductive anode layer 122. Suitable materials include but are not limited to ITO (Indium Tin Oxide), graphene sheet, Cu or Ag nanowire coatings. The electrically conductive anode layer 122 is itself topped with a protective layer (not shown) such as a standard glass. One can also use a chemically stable plastic in place of the glass as the protective layer, such as for example PET (polyethylene terephthalate). Collectively, layers 120 and 122 form the photovoltaic generator 124. In one embodiment, for MEMs switches fabricated on a substrate such as silicon, the photoactive layer 120 can easily be screen printed onto the substrate, roll to roll printed or laid down using ink jet printing techniques.

For a further discussion of natural dyes as phtosensitizers, reference is made to the articles entitled Natural dyes as phtosensitizers for dye-sensitized solar cells, Sancun Hao, et al., Solar Energy, 80 (2006) 209-214, and Manufacture of Dye-Sensitized Nano Solar Cells and their I-V curve Measurements, Yan-Sian Chen, et al., Proceedings of ICAM 2007, Nov. 26-28, 2007, Tainan, Taiwan, both of which articles are incorporated herein by reference.

The RF MEMS structure can be formed by deposition, lithographic patterning of various thin films, and releasing of "sacrificial" films below the freestanding films by selective etchants. Metal bridge or membrane 102 and signal line 104 of the RF MEMS structure are fabricated in one embodiment using aluminum because of its high resistance to fatigue and low electrical resistance. The dielectric layer that separates the membrane and the signal line can be a nano-porous $SiO_2$ layer with a thickness of, for example, 1 micron and can be deposited using a uniaxis CVD process.

Figure 5:
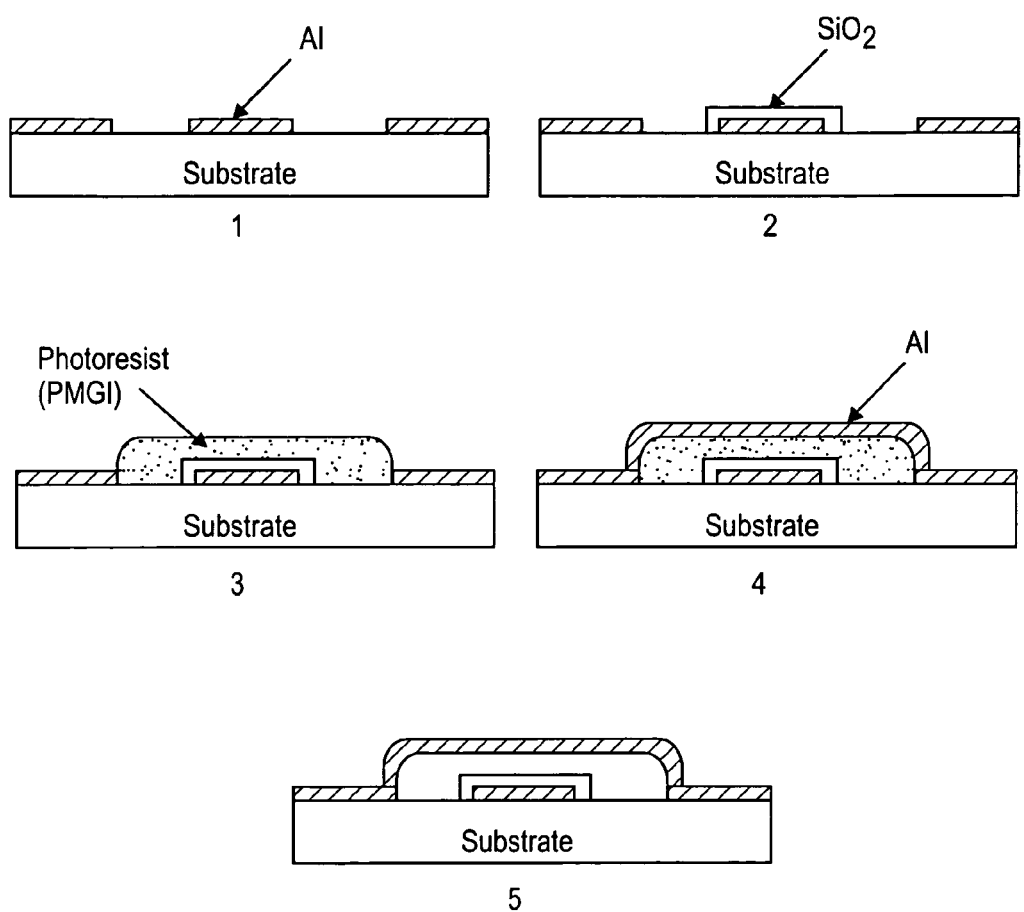
FIG. 5 is a schematic diagram showing an exemplary fabrication process for a MEMS switch according to an embodiment of the invention.

More particularly, an exemplary process for the fabrication of the RF MEMS switch of this invention is shown in FIG. 5. Arrays of RF MEMS structures can be fabricated in a first step by depositing the thin aluminum electrode which serves as signal line 104 for switch 100. An isolation dielectric layer 106 is then deposited on top of the electrode to enable the RF MEMS switch capacitor function when the membrane is pulled down. The flexible membrane 102 is deposited over a sacrificial polymer layer (such as a photoresist) that is released at the end of the surface micromachining process. After the sacrificial layer is released, flexible membrane 102 is left suspended over dielectric layer 104, with air in between. Its natural state is in the "up" or un-actuated position. When a sufficient DC electrical potential is developed between the membrane and electrode, the membrane snaps down into the actuated state.

RF MEMS switches like that shown in FIG. 1, in an embodiment, can be fabricated using the exemplary materials and dimensions listed in Table 1.

TABLE 1

| Component | Material | Dimension |
| --- | --- | --- |
| MEMS bridge | Aluminum | t = 1 μm |
|  |  | l = 150 μm |
|  |  | w = 200 μm |
| Signal line | Aluminum | Thickness = 1 μm |
|  |  | W = 100 μm |
| Dielectric layer | SiO2 | $g_{SiO2}$ = 1 μm |
| Air gap | Air | $g_{air}$ = 1.7 μm |
| GSG gap | Air | G = 25 μm |

The flexible, conductive membrane was fabricated using aluminum because of its high resistance to fatigue and low electrical resistance. Other candidate metals for use as the conductive membrane include gold, copper, and the like. The thin, nano-porous dielectric isolation layer used to separate the membrane and signal line can be deposited using a uniaxis PECVD machine. In one embodiment the dielectric layer can comprise silicon dioxide. After fabricating the RF MEMS structure, a layer of photoresist may be deposited on the surface to protect the wafer from debris and damage during dicing.

Figure 4:
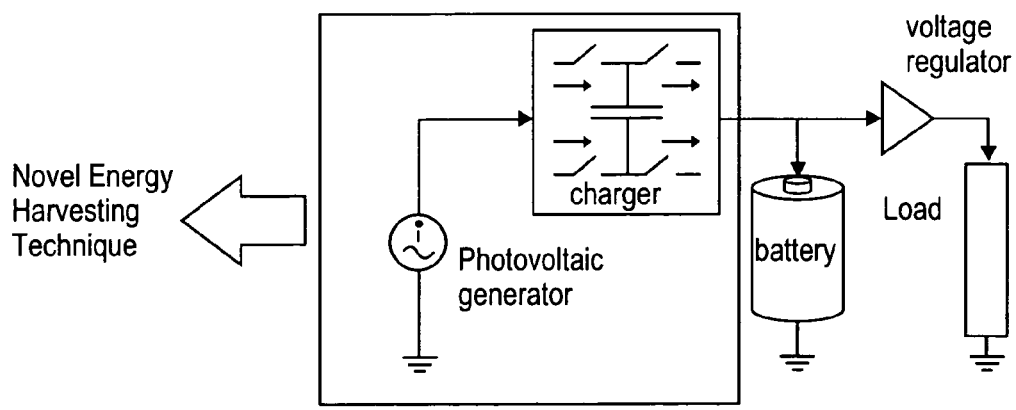
FIG. 4 is a schematic diagram of an aspect of the invention wherein the energy harvesting device is connected in an electrical circuit.

As electric charges are generated by the photosensitizing dye, they are stored between the gap of the RF MEMS. The electric charge can induce a charge in the RF MEMS switch which is then discharged to an external load or rechargeable batteries sequentially, so that the output voltage can be adjusted by controlling the on/off frequency. The frequency of discharge can be controlled in part by the design of the flexible membrane. Shorter discharge intervals will render very high peeks frequently, so that the average voltage is high. Such an exemplary energy harvesting system is illustrated in FIG. 4.

According to one embodiment, as the energy harvesting switch is exposed to sunlight charge begins to build up within the photovoltaic generator 124. As the charge continues to build an electrostatic force is generated between signal line 104 and flexible membrane 102, the higher the charge build up, the greater the electrostatic force generated between the signal line and the membrane. The charge builds until a pull down threshold is reached, the membrane then pulled down into contact with dielectric layer 106. In this configuration a capacitive discharge occurs, the charge which had been stored in the photovoltaic generator released to signal line 108. As shown in FIGS. 3 and 4, the pulsed power can then be directed, such as to a load or used to charge a battery. In the latter case, a converter (not shown) can be placed in line between the energy harvesting switch and the battery.

Once the membrane has been pulled down into the switch down or on position, and the discharge is complete, the membrane returns to the open or switch up position and the cycle begins again due to the insufficient electrostatic force in comparison to mechanical restoring force of the membrane. In experiments so far run it has been found that photovoltaic generator 124 can provide a low, continuous current of about 0.2V-0.5 V, depending on the photosensitizer material. Whereas, the output current after charge/discharge control can achieve pulsed voltages five or more times higher, such as in the range of about 0.5 V-4.2 volts.

Figure 6:
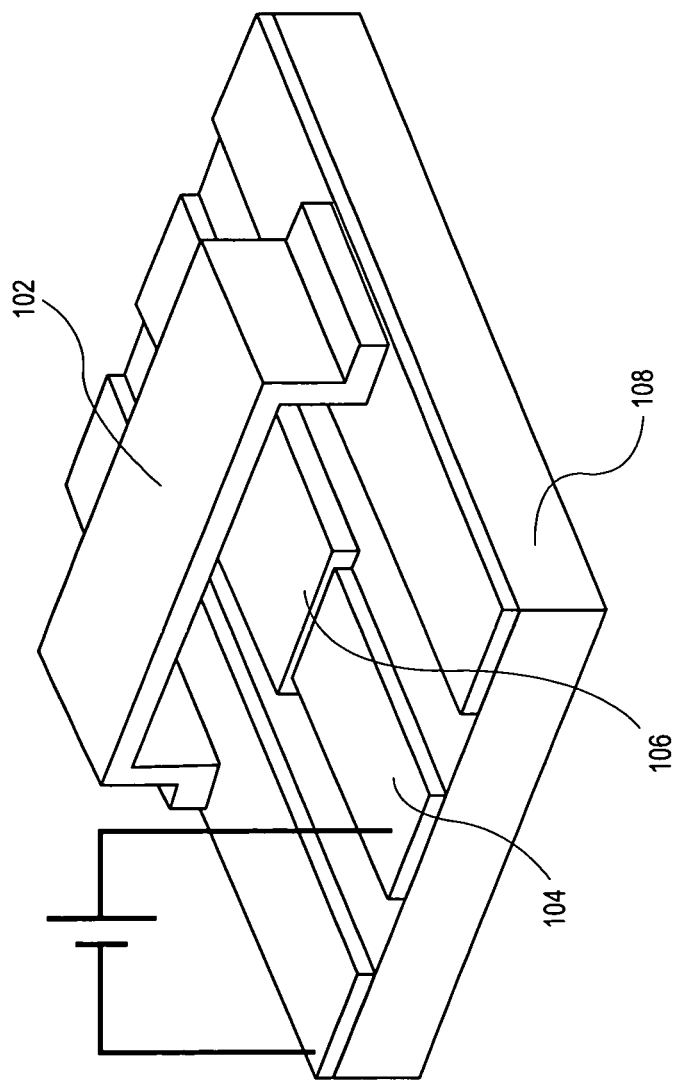
FIG. 6 is a three dimensional rendition of a single RF MEMS energy harvesting structure according to an embodiment of the invention.

The membrane overlap over the signal isolation layer plays an import role in determining the maximum energy that can be stored per area of the RF MEMS, the degree of overlap a function of both the width and length of the membrane, as illustrated in the three dimensional rendition of FIG. 6. A more complete discussion of the energy harvesting device of this invention can be found in the attached article entitled Energy Harvesting using RF MEMS, Yunhan Huang, et al., June 2010, Electronic Components and Technology Conference, pp. 1353-1358, the contents of which article is incorporated herein by reference as if fully set forth in its entirety.

It has been found that RF MEMS based energy harvester of this invention is a potential contender for solar energy harvesting. The technique provides a promising solution to the design of self-powered microsystems. These devices may also fulfill the high demand for use in wireless sensor networks, portable electronics, etc.

While the foregoing is directed to embodiments of the present invention, other and further embodiments of the invention may be devised without departing from the basic scope thereof, and the scope thereof is determined by the claims that follow.

What we claim is:

1. A discontinuous electrostatic charge transfer device for harvesting solar energy comprising a capacitive RF MEMS switch employing a flexible membrane, in which a layer of a photosensitive material comprising a photosensitive dye is coated onto said flexible membrane of said capacitive RF MEMS switch structure, wherein the layer of photosensitive material is configured to impart a charge to said flexible membrane and the RF MEMS switch structure includes a bottom metal signal line coated with a dielectric material, the flexible membrane separated from said bottom coated metal signal line by an air gap, whereby the air gap between said flexible membrane and said bottom metal signal line is fixed such that when the membrane is flexed, it makes electrical contact with said bottom metal signal line.

2. The device of claim 1 wherein the flexible membrane is conductive.

3. The device of claim 2 wherein the flexible membrane comprises a metal selected from the group comprising aluminum, copper, and gold.

4. The device of claim 3 wherein the flexible conductive membrane is aluminum.

5. The device of claim 1 wherein the dielectric material is $SiO_2$.

6. The device of claim 1 wherein the bottom metal signal line is aluminum.

7. The device of claim 1 wherein the photosensitive dye comprises an extract from blue berries.

8. The device of claim 1 wherein the layer of photosensitive dye is coated with an electrically conductive transparent anode.

9. The device of claim 8 wherein the electrically conductive transparent anode comprises a layer of indium tin oxide.

10. The device of claim 1 wherein the bottom metal signal line is deposited upon a mechanically rigid substrate.

11. The device of claim 10 wherein the mechanically rigid substrate is silicon.

12. The device of claim 11 wherein an insulating layer is situated upon the mechanically rigid substrate underneath the bottom metal signal line to electrically isolate the bottom metal signal line from the mechanically rigid substrate.

* * * * *